US012180104B2

(12) United States Patent
Yamaguchi et al.

(10) Patent No.: US 12,180,104 B2
(45) Date of Patent: Dec. 31, 2024

(54) HEAT-REFLECTING MEMBER, AND METHOD FOR MANUFACTURING GLASS MEMBER HAVING HEAT-REFLECTING LAYER INCLUDED THEREIN

(71) Applicants: SHIN-ETSU QUARTZ PRODUCTS CO., LTD., Tokyo (JP); HERAEUS QUARZGLAS GMBH & CO. KG, Hanau (DE)

(72) Inventors: Kazuhiro Yamaguchi, Tokyo (JP); Daiki Fujita, Yamagata (JP); Yoshihiro Harada, Yamagata (JP); Toru Segawa, Fukushima (JP); Tomonori Watanabe, Fukushima (JP)

(73) Assignees: Shin-Etsu Quartz Products Co., Ltd., Tokyo (JP); Heraeus Quarzglas GmbH & Co. KG, Hanau (DE)

( * ) Notice: Subject to any disclaimer, the term of this patent is extended or adjusted under 35 U.S.C. 154(b) by 245 days.

(21) Appl. No.: 17/765,230

(22) PCT Filed: Sep. 18, 2020

(86) PCT No.: PCT/JP2020/035379
§ 371 (c)(1),
(2) Date: Mar. 30, 2022

(87) PCT Pub. No.: WO2021/065556
PCT Pub. Date: Apr. 8, 2021

(65) Prior Publication Data
US 2022/0348490 A1 Nov. 3, 2022

(30) Foreign Application Priority Data

Sep. 30, 2019 (JP) ................................. 2019-179740

(51) Int. Cl.
*C03B 19/06* (2006.01)
*C03B 33/07* (2006.01)
*C03B 33/08* (2006.01)

(52) U.S. Cl.
CPC ............ *C03B 19/066* (2013.01); *C03B 33/07* (2013.01); *C03B 33/082* (2013.01)

(58) Field of Classification Search
CPC ........... B32B 2264/50–504; B32B 2307/7242; B32B 2307/7244; B32B 2307/7246;
(Continued)

(56) References Cited

U.S. PATENT DOCUMENTS 5,885,071 A * 3/1999 Watanabe ............. C30B 35/002
428/34.1
9,469,560 B2 * 10/2016 Sudo ..................... C03B 19/066
(Continued)

FOREIGN PATENT DOCUMENTS

CN 102534756 7/2012
JP 2004-091314 3/2004
(Continued)

OTHER PUBLICATIONS

JP 2013-035723 A, Watanabe et al., English translation (Year: 2013).*
(Continued)

*Primary Examiner* — Alison L Hindenlang
*Assistant Examiner* — Steven S Lee
(74) *Attorney, Agent, or Firm* — Dicke, Billig & Czaja, PLLC

(57) ABSTRACT

Provided is a heat reflective member, which is prevented from braking even in a high-temperature environment. It generates no dust in use, and can be washed with a chemical liquid. The heat reflective member has a laminated structure in which quartz glass layers are formed on an upper surface
(Continued)

and a lower surface of a siliceous sintered powder layer. The heat reflective member includes: an impermeable layer which is formed at a portion of the siliceous sintered powder layer at an end portion of the heat reflective member, which has a thickness at least larger than half of a thickness of the siliceous sintered powder layer, and through which a gas or a liquid is prevented from penetrating; and a buffer layer which is formed between the impermeable layer and the siliceous sintered powder layer, and which changes in density from the impermeable layer toward the sintered powder layer.

4 Claims, 8 Drawing Sheets

(58) Field of Classification Search
CPC ...... B32B 2307/7265; B32B 17/10302; B32B 17/068; B32B 5/14–147; B32B 17/06; B32B 2264/1021; B32B 2307/72; B32B 2307/722; B32B 5/16; B32B 2307/30; C03B 19/066; C03B 20/00; C03B 33/07; B23K 26/38; C03C 33/08; C30B 35/00; C30B 35/002; C30B 15/10; B23K 26/402
See application file for complete search history.

(56) References Cited

U.S. PATENT DOCUMENTS

| | | | | |
|---|---|---|---|---|
| 2002/0192409 | A1* | 12/2002 | Ohama | C03B 19/095 428/34.6 |
| 2003/0041623 | A1* | 3/2003 | Werdecker | C30B 15/10 428/34.4 |
| 2003/0106491 | A1* | 6/2003 | Kemmochi | C30B 15/10 117/200 |
| 2004/0072007 | A1* | 4/2004 | Kemmochi | C03B 19/095 428/544 |
| 2005/0235907 | A1* | 10/2005 | Ohama | C30B 15/10 65/33.1 |
| 2006/0046075 | A1* | 3/2006 | Maul | C03C 1/008 65/17.2 |
| 2007/0051297 | A1* | 3/2007 | Kemmochi | C30B 15/10 117/13 |
| 2010/0115996 | A1* | 5/2010 | Werdecker | C03C 1/008 977/773 |
| 2010/0319608 | A1* | 12/2010 | Kanda | C30B 15/10 65/33.4 |
| 2011/0114530 | A1* | 5/2011 | Yamagata | C30B 29/06 206/524.6 |
| 2011/0123738 | A1* | 5/2011 | Kemmochi | C03B 19/095 428/34.4 |
| 2012/0137964 | A1* | 6/2012 | Sudo | C30B 15/10 117/208 |
| 2012/0160158 | A1* | 6/2012 | Sudo | C30B 15/10 65/17.3 |
| 2016/0340256 | A1* | 11/2016 | Oribe | B32B 5/30 |
| 2017/0036303 | A1* | 2/2017 | Oribe | B23K 26/38 |

FOREIGN PATENT DOCUMENTS

| | | | | |
|---|---|---|---|---|
| JP | 2004067456 | | 3/2004 | |
| JP | 2004067456 A | * | 3/2004 | ........... C03B 23/203 |
| JP | 2010-531799 | | 9/2010 | |
| JP | 2013-035723 | | 2/2013 | |
| JP | 2013035723 A | * | 2/2013 | |
| JP | 2008063207 | | 3/2021 | |

OTHER PUBLICATIONS

唐洁吟, First Office Action for Applicatio No. 202080066964.X, State Intellectual Property Office of People's Republic of China, Nov. 1, 2023 (Year: 2023).*

* cited by examiner

HEAT-REFLECTING MEMBER, AND METHOD FOR MANUFACTURING GLASS MEMBER HAVING HEAT-REFLECTING LAYER INCLUDED THEREIN

CROSS REFERENCE TO RELATED APPLICATION

This Utility Patent Application claims priority under 35 U.S.C. § 371 to International Application Serial No. PCT/JP2020/035379, filed Sep. 18, 2020, which claims the benefit of Japanese Patent Application No. 2019-179740, filed Sep. 30, 2019; which are both incorporated herein by reference.

TECHNICAL FIELD

The present invention relates to a heat reflective member having a high reflectance and a method of manufacturing a glass member with a heat reflective layer.

BACKGROUND ART

When a high-temperature atmosphere is required, for example, in an electric furnace, a heating atmosphere is generally covered with a heat insulating material, such as an alumina heat insulating material, in order to prevent inside heat from escaping outside. The same applies to a heat treatment furnace used in the semiconductor industry. Such heat insulating material contributes to heat retention and thermal uniformity of the high-temperature atmosphere and a target to be treated therein by absorbing heat in itself. Accordingly, in controlling the temperature of an electric furnace, the heat retention property of the heat insulating material has slowed down the temperature control responsiveness of a product to be treated in the electric furnace. In particular, a heat treatment step in the semiconductor industry requires heat insulating means which prevents inside heat from escaping and has low heat absorption (a low heat capacity) in order to increase a throughput.

As countermeasures against the foregoing, for example, a sheet or a cylindrical ring of opaque quartz glass having a large number of microbubbles has hitherto been used as heat shielding means. However, for example, it is required that many disc-shaped opaque quartz glass sheets be arranged next to each other at an inlet of the furnace in order to effectively perform heat shielding. As a result, heat capacity is increased. Accordingly, in particular, heat insulating means which shields heat rays from an inside of the furnace and efficiently reflects the heat rays, and has a low heat capacity (a small volume) has been required.

In view of the foregoing, for example, there is devised a product obtained by coating a quartz glass sheet with gold or a product as described in Patent Document 1 utilizing a reflective layer obtained by applying a silica slurry. However, for example, a reflective material based on a metal, such as gold, was difficult to use particularly in applications in which metal impurities were unfavorable, such as the semiconductor industry, while having high performance.

In addition, a method involving utilizing a silica slurry or the like requires a grain aggregate structure in which silica particles are partially fused to each other to form an aggregate in order to obtain high reflection performance. Such structure has problems of having instability in its strength owing to a limited contact area between the particles and undergoing dissolution or peeling even through washing with water or a chemical liquid, and also has a problem in that, once the structure is contaminated, the contaminant is difficult to remove because the structure is porous. Thus, the method was difficult to use in applications for the semiconductor industry in which high purity is required.

In order to solve those problems, various attempts have been made. For example, in Patent Document 1, an attempt has been made to form a transparent silica layer on the surface of a sintered body layer of powder derived from a slurry. In this method, it is required that at least heat for melting or generating silica be applied in order to form the transparent silica layer. In that case, particles of a grain aggregate layer, which serves as a reflective layer, are fused to each other. As a result, reflection performance is reduced, or strain occurs owing to a change in volume at the time of forming the transparent layer or a difference in expansion and contraction between the transparent layer and the grain aggregate layer, leading to occurrence of cracks or the like and breakage. There was a problem of difficulty in controlling heating as described above.

PRIOR ART

Patent Document

Patent Document 1: JP 2013-035723 A

SUMMARY OF THE INVENTION

Problems to be Solved by the Invention

An object of the present invention is to provide a heat reflective member, which is prevented from being broken even in a high-temperature environment at the time of its manufacturing and its use while maintaining a high reflectance, generates no dust at the time of its use, and can be washed with a chemical liquid, and a method of manufacturing a glass member with a heat reflective layer suitable as the heat reflective member.

Means for Solving the Problems

In order to achieve the above-mentioned object, according to one embodiment of the present invention, there is provided a heat reflective member having a laminated structure in which quartz glass layers are formed on an upper surface and a lower surface of a siliceous sintered powder layer, wherein the heat reflective member includes: an impermeable layer which is formed at a portion of the siliceous sintered powder layer at an end portion of the heat reflective member, which has a thickness at least larger than half of a thickness of the siliceous sintered powder layer, and through which a gas or a liquid is prevented from penetrating; and a buffer layer which is formed between the impermeable layer and the siliceous sintered powder layer, and which changes in density from the impermeable layer toward the sintered powder layer.

The heat reflective member may include a plurality of the siliceous sintered powder layers, and the siliceous sintered powder layers and the quartz glass layers may be alternately laminated. The plurality of siliceous sintered powder layers may each have the buffer layer and the impermeable layer formed at an end portion thereof, and may each have a structure in which the siliceous sintered powder layer is prevented from being exposed outside.

The plurality of siliceous sintered powder layers may be formed of powders having particle diameter distributions different from each other.

The quartz glass layers each suitably have a planar shape, a curved shape, or a cylindrical shape.

A method of manufacturing a glass member with a heat reflective layer according a first aspect of the present invention includes the steps of; producing an intermediate glass laminate having a laminated structure in which quartz glass layers are formed on an upper surface and a lower surface of a siliceous sintered powder layer; and cutting out the intermediate glass laminate into a predetermined shape with a laser and generating an impermeable layer and a buffer layer simultaneously at a cut-out end portion of the sintered powder layer at the same time as the cutting, to thereby manufacture a glass member with a heat reflective layer.

A method of manufacturing a glass member with a heat reflective layer according a second aspect of the present invention includes the steps of producing an intermediate glass laminate having a laminated structure in which quartz glass layers are formed on an upper surface and a lower surface of a siliceous sintered powder layer; heating and firing the sintered powder layer with a laser at a power enough to keep the sintered powder layer from cutting or with burner flame from a quartz glass layer side on an outer surface along a site of the intermediate glass laminate to be cut out into a predetermined shape, to thereby form a fired site including a buffer layer or a buffer layer and an impermeable layer; and further cutting out a position at which the fired site is formed with a laser to form an end portion structure including a stronger buffer layer and a stronger impermeable layer, to thereby manufacture a glass member with a heat reflective layer.

Advantageous Effects of the Invention

According to the present invention, the heat reflective member, which is prevented from being broken even in a high-temperature environment at the time of its manufacturing and its use while maintaining a high reflectance, generates no dust at the time of its use, and can be washed with a chemical liquid, and the method of manufacturing a glass member with a heat reflective layer suitable as the heat reflective member can be provided.

In addition, according to the method of the present invention, the intermediate glass laminate having a structure in which the siliceous sintered powder layer which shields heat rays and efficiently reflects the heat rays, has a low heat capacity (a small volume), and is excellent in heat insulation (heat shielding) is sandwiched between the quartz glass layers can easily be completely sealed and processed into a shape at the same time through laser processing while the buffer layer and the impermeable layer are formed therein.

According to the present invention, the plurality of siliceous sintered powder layers each having high reflection performance can be formed, and hence an increase in reflectance can be expected in a wide wavelength range or at a selected wavelength, and improvement in durability can be expected. Thus, the glass member with a heat reflective layer, which is prevented from being broken at the time of its use under high temperature, generates no dust caused by sintered powder in itself or a substance trapped in the powder, can be subjected to washing with a chemical liquid, such as washing with HF, and can be used in applications for high purity, can be manufactured.

In addition, according to the present invention, a structure in which a plurality of heat reflective layers are each easily sandwiched between the quartz glass layers can be achieved, and complete sealing and shape processing thereof can easily be achieved at the same time through laser processing while the buffer layer and the impermeable layer are formed. Such structure can be formed without a reduction in reflection performance by minimizing fusion between particles of the reflective layer (siliceous sintered powder layer) or fusion of the reflective layer to the quartz glass layer. The heat reflective member including a plurality of such reflective layers can be manufactured.

BRIEF DESCRIPTION OF THE DRAWINGS

FIG. 1($a$) is a schematic partial sectional view, and FIG. 1($b$) is an enlarged view of the portion A of FIG. 1($a$).

FIG. 2($a$) is a schematic partial sectional view, and FIG. 2($b$) is an enlarged view of the portion B of FIG. 2($a$).

FIG. 3($a$) is a schematic partial sectional view, and FIG. 3($b$) is an enlarged view of the portion C of FIG. 3($a$).

FIG. 4($a$) is a side view, FIG. 4($b$) is a perspective view, and FIG. 4($c$) is an enlarged view of the portion D of FIG. 4($b$).

FIG. 7($a$) is a cross-sectional photograph of an outer periphery of a heat reflective member obtained in Example 1, and FIG. 7($b$) is a schematic view thereof.

MODE FOR CARRYING OUT THE INVENTION

Embodiments of the present invention are described below with reference to the attached drawings. It goes without saying that illustrated examples are merely described as examples and various modifications may therefore be made without departing from the technical concept of the present invention.

Figure 1A:
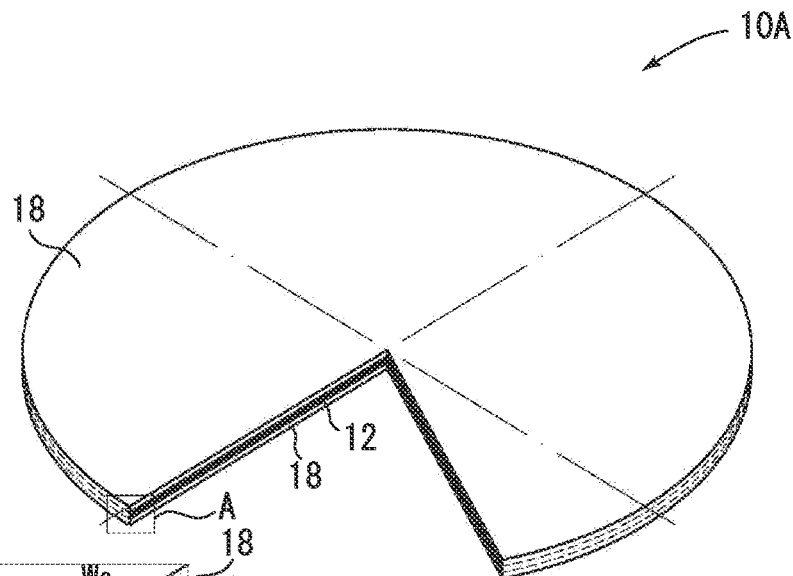
FIG. 1 are each a schematic view for illustrating a heat reflective member according to a first aspect of the present invention.
Figure 1B:
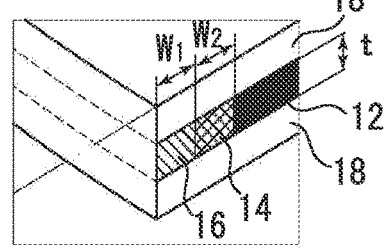

FIG. 1 are each a schematic view for illustrating a heat reflective member according to a first aspect of the present invention. FIG. 1($a$) is a schematic partial sectional view of a heat reflective member 10A of the present invention, and FIG. 1($b$) is an enlarged view of a portion of the heat reflective member 10A denoted by reference symbol A in FIG. 1($a$).

The heat reflective member 10A of the present invention is a heat reflective member having a laminated structure in which quartz glass layers 18 are formed on an upper surface and a lower surface of a siliceous sintered powder layer 12, wherein the heat reflective member includes: an impermeable layer 16 which is formed at a portion of the siliceous sintered powder layer 12 at an end portion of the heat reflective member, which has a thickness at least larger than half of a thickness of the siliceous sintered powder layer 12, and through which a gas or a liquid is prevented from penetrating; and a buffer layer 14 which is formed between the impermeable layer 16 and the siliceous sintered powder layer 12, and which changes in density from the impermeable layer 16 toward the sintered powder layer 12.

In the heat reflective member 10A of the present invention, the siliceous sintered powder layer acts as a heat reflective material. As the siliceous sintered powder layer 12, an opaque siliceous sintered powder layer is preferred, a white and opaque siliceous sintered powder layer is more preferred, and an opaque siliceous sintered powder layer which does not substantially transmit light, and for example, has a light transmittance of 1% or less at a wavelength of from 400 nm to 2,000 nm is still more preferred.

In general, infrared heat rays are assumed, but in order to suppress leakage of energy from a heat treatment space, it is advantageous to have high reflection performance in as wide a range as possible from a visible region to an infrared region. The reflective member of the present invention suitably has a reflectance of 60% or more at a wavelength of from 1,000 nm to 2,000 nm. In addition, the reflective member suitably has an in-plane reflectance distribution of ±5% or less at a specific wavelength.

The siliceous sintered powder layer 12 only needs to be a layer in which a distinct grain aggregate structure is formed. The "grain aggregate structure" refers to a structure in which silica particles are partially fused to each other to form an aggregate. Heat ray reflection occurs at an interface between voids and particles, and hence it is contrarily suitable for the heat ray reflection that the voids be moderately included. However, when the voids are too large, a fused portion between the particles is reduced, and strength as a layer cannot be maintained so that peeling may occur in the layer. In addition, when the voids are reduced and the fused portion is increased, a reflection interface is reduced so that reflection efficiency for heat is reduced. Accordingly, a volume ratio between the particles and the voids suitably falls within a range of from 5:5 to 8:2.

In addition, the siliceous sintered powder layer 12 suitably has a bulk density of from 1.3 g/cm$^3$ to 1.5 g/cm$^3$.

A reflection wavelength depends on, for example, the particle diameter of the grain aggregate, and hence also the particle diameter is an important factor. It is suitable that 50% of the grain aggregate be distributed within a range of from 0.1 μm to 5 μm.

Similar effects are obtained even when the material is not siliceous. However, silica, which does not become an impurity in itself, has a small thermal expansion coefficient, and also has high heat resistance, is most suitable for use at high temperature.

The thickness "t" of the siliceous sintered powder layer 12 is suitably 100 μm or more, more suitably from 200 μm to 1,000 μm. When the thickness of the siliceous sintered powder layer is small, reflection efficiency for heat is reduced. A high reflectance is desired for heat shielding and heat insulating characteristics for heat rays. A reflectance comparable to or higher than that of a reflective material based on a metal, such as gold, an existing reflective layer using a silica slurry, or opaque quartz glass including bubbles is effective. The reflectance is preferably prevented from falling below 60%, and is more preferably 80% or more.

A forming method for the siliceous sintered powder layer 12 is not particularly limited, and a known method may be used. For example, a method involving applying a slurry containing silica glass particles and water onto the quartz glass layer 18 and drying the slurry, and heating the resultant silica powder layer, to thereby form the siliceous sintered powder layer 12 is suitable. In addition, a method involving spraying powder or directly placing powder and press-forming the powder into a layered shape to form a silica powder layer, and heating the silica powder layer, to thereby form the siliceous sintered powder layer may be adopted.

The quartz glass layer 18 is preferably a transparent quartz glass layer having a small thermal expansion coefficient as with the siliceous sintered powder layer 12. In the case of opaque quartz glass containing bubbles in a large amount, there is a risk in that heat rays do not reach the siliceous sintered powder layer 12 serving as a heat reflective layer, and may be scattered by the opaque quartz glass.

In addition, at an adhesion interface between the siliceous sintered powder layer 12 and each of the quartz glass layers 18, when a fused portion between particles of a grain aggregate for forming the siliceous sintered powder layer 12 and the quartz glass layer 18 is large, an interface between the particles on a grain aggregate side and the voids is reduced. As a result, reflection efficiency is reduced. Meanwhile, when the fused portion is small, there is a risk in that both the layers may be peeled off from each other at the adhesion interface at the time of use. It is suitable that about 10% to about 50% of the area of the adhesion interface be fused to the particles of the grain aggregate.

It is suitable that the thickness of the quartz glass layer 18 be larger than that of the siliceous sintered powder layer 12 because the siliceous sintered powder layer 12 requires voids, and hence the strength needs to be maintained by the quartz glass layers 18 which sandwich the siliceous sintered powder layer 12.

Figure 2B:
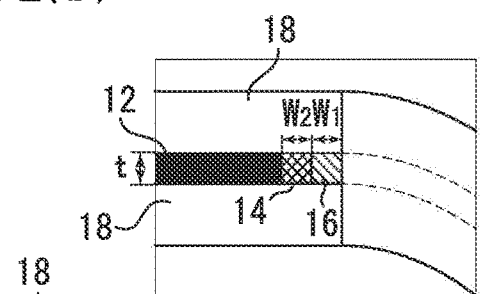
FIG. 2 are each a schematic view for illustrating a heat reflective member according to a second aspect of the present invention.
Figure 2A:
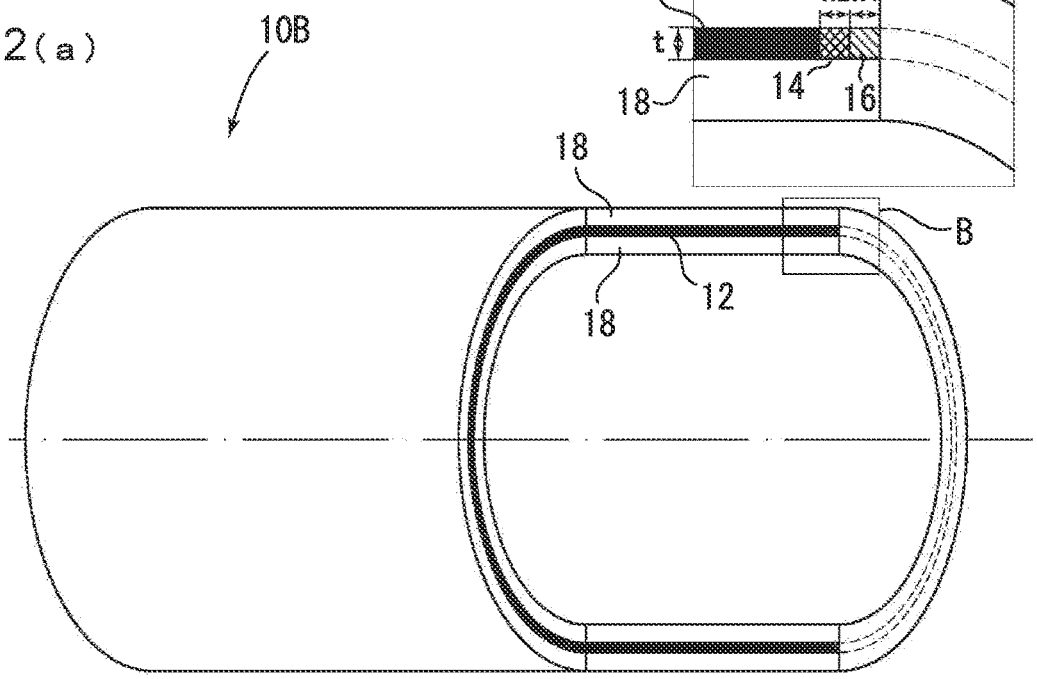
Figure 3A:
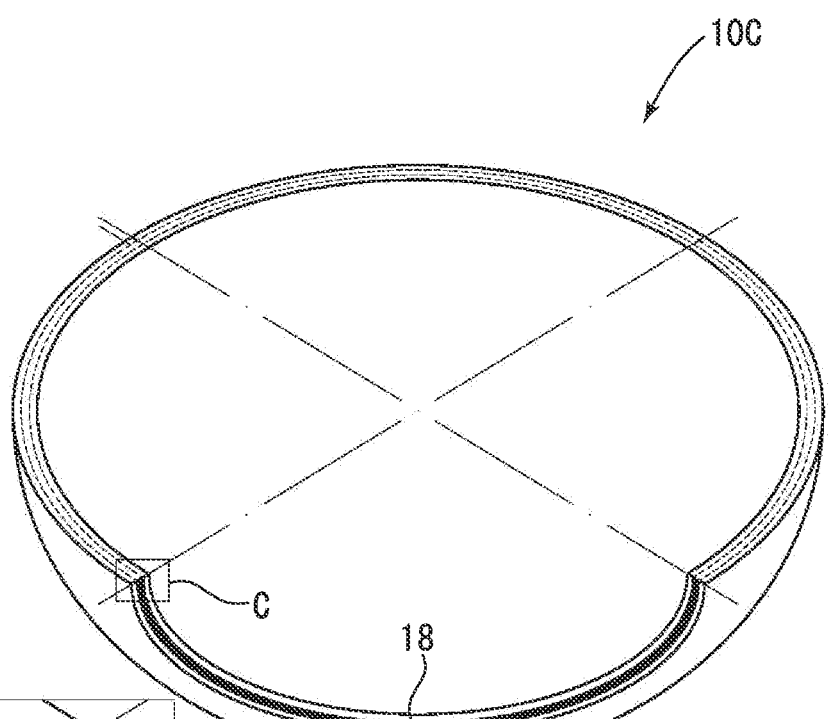
FIG. 3 are each a schematic view for illustrating a heat reflective member according to a third aspect of the present invention.
Figure 3B:
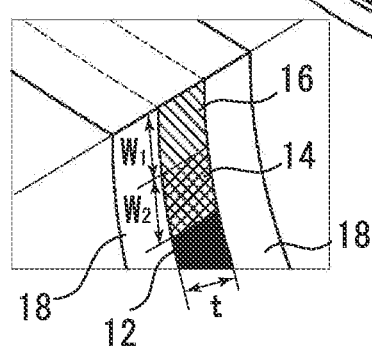

While an example in which the quartz glass layer 18 has a disc shape is illustrated in FIG. 1, the shapes of the quartz glass layer 18 and the heat reflective member 10A of the present invention are not particularly limited. Any shape may be adopted as long as the quartz glass layers can be formed on the upper surface and the lower surface of the siliceous sintered powder layer. The heat reflective member 10A is formed in accordance with the shape of the quartz glass layer 18, and hence the shapes of the quartz glass layer 18 and the heat reflective member 10A may be appropriately selected as required. The shape of the quartz glass layer 18 is suitably, for example, a planar shape, a curved shape, or a cylindrical shape. An example of a heat reflective member 10B including a quartz glass layer 18 having a cylindrical shape is illustrated in FIG. 2, and an example of a heat reflective member 10C including a quartz glass layer 18 having a curved shape is illustrated FIG. 3.

Figure 4A:
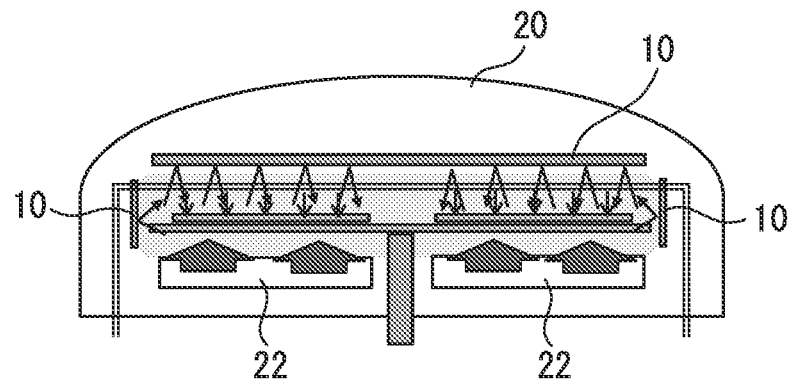
FIG. 4 are each a schematic explanatory view for illustrating an example of a method of using a heat reflective member of the present invention.
Figure 4B:
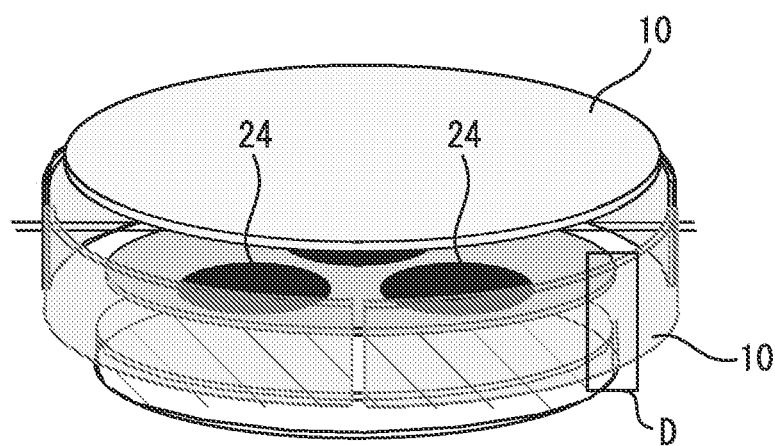
Figure 4C:
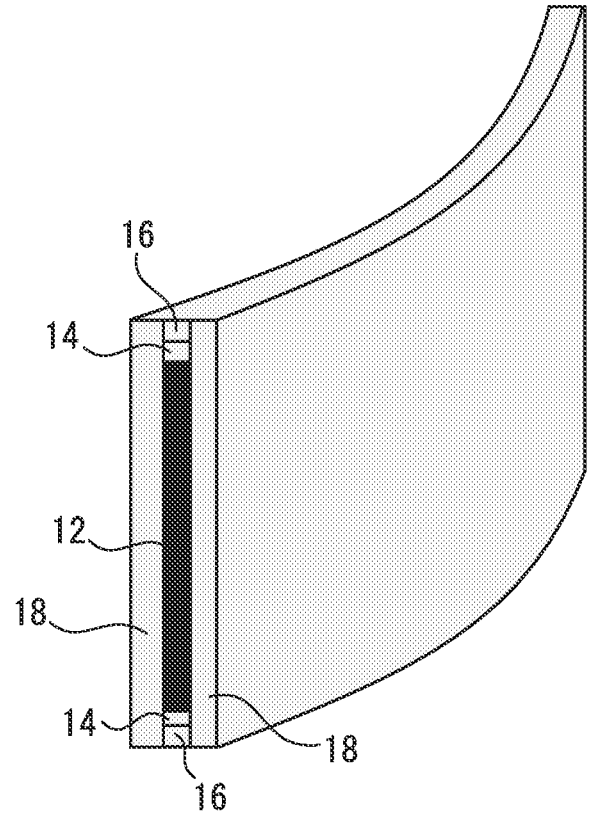

An example in which a heat reflective member 10 of the present invention is used as a heat reflective member for a heat treatment furnace is illustrated in FIG. 4. As illustrated in FIG. 4, it is appropriate that the heat reflective member 10 to be used have a planar shape and the heat reflective member 10 having a planar shape be placed in an upper portion or a lower portion of a reaction furnace to keep heat of a heater 22 in the furnace. In addition, as illustrated in FIG. 4, it is appropriate that the heat reflective member 10 to be used have a curved shape or a cylindrical shape and the heat reflective member 10 be arranged in a peripheral portion of the reaction furnace circumferentially in a divided manner or an integrated manner to keep heat of the heater 22 in the furnace.

The impermeable layer 16 formed at the end portion of the heat reflective member 10A is a strong impermeable layer through which a gas or a liquid is prevented from penetrating, and which has a higher density than the siliceous sintered powder layer 12. The impermeable layer 16 can prevent the siliceous sintered powder layer 12 from being peeled from end portions of the quartz glass layers 18 which sandwich the fragile siliceous sintered powder layer 12 therebetween, and can also prevent a gas or a liquid from permeating into the siliceous sintered powder layer 12 from the end portions.

The impermeable layer 16 is suitably a layer free of voids through which a gas or a liquid penetrates.

The heat reflective member 10A includes the buffer layer 14 which is formed between the impermeable layer 16 and the siliceous sintered powder layer 12, and which changes in density from the impermeable layer 16 toward the sintered powder layer 12.

The siliceous sintered powder layer 12 includes a large number of voids, and hence when an end portion thereof is covered with the impermeable layer 16, an internal pressure of the siliceous sintered powder layer 12 surrounded by the quartz glass layers 18 and the impermeable layer 16 may be increased owing to expansion of a gas remaining in the voids of the sintered powder layer 12 or vaporization of a component adsorbed onto a powder surface. As a result, a stress is concentrated at a joint portion of the impermeable layer 16 at the end portion, the siliceous sintered powder layer 12, and the quartz glass layers 18, and there is a risk in that cracking or breakage may occur.

In addition, the siliceous sintered powder layer 12 in itself is more liable to cause a change in volume, such as contraction or expansion, by external heat than the quartz glass layer 18. Based on all of those situations, a stress is concentrated at the joint portion of the impermeable layer 16 at the end portion, the siliceous sintered powder layer 12, and the quartz glass layers 18, and there is a risk in that cracking or breakage may occur.

Accordingly, in the present invention, the buffer layer 14 which has a density gradient from the impermeable layer 16 toward the sintered powder layer 12 is formed between the impermeable layer 16 having a high density and the sintered powder layer 12 having a low density. Specifically, the buffer layer 14 is suitably a layer in which the number of bubbles is reduced from the sintered powder layer 12 toward the impermeable layer 16. Such buffer layer 14 can prevent the stress from being concentrated at the end portion, and eliminate the risk of breakage.

It is required that the thickness (width $W_1$) of the impermeable layer 16 be 50% or more of the thickness "t" of the siliceous sintered powder layer 12 in order to maintain its strength for bonding the layers and its impermeability. In that case, it is desired that the thickness (width $W_2$) of the buffer layer 14 be 10% or more of the thickness "t" of the sintered powder layer 12. Attention needs to be paid to the following: when the thickness of the impermeable layer 16 is insufficient, and heating is performed under the state in which a liquid or a gas penetrates into the powder layer 12, a sheet state is broken owing to an abrupt increase in internal pressure.

The heat reflective member of the present invention is a member including one or more siliceous sintered powder layers 12, and may be a member including a plurality of siliceous sintered powder layers 12, in which the siliceous sintered powder layers 12 and the quartz glass layers 18 are alternately laminated. When the plurality of siliceous sintered powder layers 12 are included, the siliceous sintered powder layers 12 may be the same or different from each other. A reflection wavelength depends on the particle diameter in the siliceous sintered powder layer, and hence when a plurality of layers having different particle diameter distributions of grain aggregates are arranged, reflection can be efficiently achieved in a wide range.

A method of manufacturing the heat reflective member of the present invention is not particularly limited, but is suitably a method involving: producing an intermediate glass laminate having a laminated structure in which the quartz glass layers are formed on the upper surface and the lower surface of the siliceous sintered powder layer; and cutting out the intermediate glass laminate into a predetermined shape, for example, with a laser, to thereby manufacture a heat reflective member in which the buffer layer 14 and the impermeable layer 16 are formed at the end portion of the siliceous sintered powder layer 12. The buffer layer 14 and the impermeable layer 16 may be formed simultaneously with the cutting. Alternatively, the buffer layer 14 and/or the impermeable layer 16 may be formed in advance, followed by the cutting.

The intermediate glass laminate having a laminated structure in which the quartz glass layers are formed on the upper surface and the lower surface of the siliceous sintered powder layer may be cut out into a predetermined shape by melt cutting, for example, with a laser. At this time, when an appropriate moving speed of a laser beam is adopted, the impermeable layer and the buffer layer can be simultaneously formed at a cut-out end portion of the sintered powder layer at the same time as the intermediate glass laminate is cut out into a predetermined shape with a laser. An appropriate moving speed is suitably selected as the moving speed of the laser beam depending on, for example, the output of the laser to be used.

Through heat of the laser beam, the siliceous sintered powder layer is partially fired and partially melted. In the course thereof, the sintered powder layer proceeds with melting, and the impermeable layer is formed in the vicinity of a melt-cut portion of the sintered powder layer. A portion of the sintered powder layer having been partially melted from the portion of the sintered powder layer having been fired serves as the buffer layer having an appropriate density gradient between the sintered powder layer not having been fired and the impermeable layer.

By the above-mentioned method, a heat reflective member including a strong and highly-airtight impermeable layer and a strong and highly-airtight buffer layer at the end portions of the quartz glass layers and the siliceous sintered powder layer having different densities laminated on each other can easily be manufactured.

As a method of forming the buffer layer 14 and the impermeable layer 16 in advance, followed by cutting, for example, there may be adopted a method involving: prior to cutting, heating and firing the sintered powder layer by heat of a weak laser having a power enough to keep the sintered powder layer from cutting or with weak burner flame from a quartz glass layer side on an outer surface along a position at the end portion of the intermediate glass laminate to be cut out, to thereby form a fired site including a buffer layer or a fired site including a buffer layer and an impermeable layer; and then cutting out the position with an intense laser to form an end portion structure including a stronger buffer layer and a stronger impermeable layer, to thereby manufacture a heat reflective member in which the buffer layer 14 and the impermeable layer 16 are formed at the end portion of the siliceous sintered powder layer 12.

When the step of forming the buffer layer or the buffer layer and the impermeable layer and the step of cutting out the position are performed in two stages, the degree of freedom of combining position setting and input heat amount setting in the respective steps is increased. In addition, there is also an advantage in that breakage due to strain is less liable to occur after a cut-out operation with a laser because, through preheat treatment, a gas to be generated, such as a water vapor, is gradually released, or the sintered powder layer is increased in density at the end portion thereof, and at the time of subsequent irradiation with a high-intensity laser for cutting out the end portion, its change in volume becomes small.

The laser to be used for the cutting is not particularly limited, but is suitably, for example, a carbon dioxide gas laser.

A method of producing the intermediate glass laminate having a laminated structure in which the quartz glass layers are formed on the upper surface and the lower surface of the siliceous sintered powder layer is not particularly limited, but is suitably a method involving: forming an intermediate laminate having a laminated structure in which quartz glass members are formed on the upper surface and the lower surface of a silica powder layer; heating the intermediate laminate to turn the silica powder layer into a siliceous sintered powder layer and to integrate the intermediate laminate, to thereby form an intermediate glass laminate. In addition, there may also be adopted a method involving: forming a siliceous sintered powder layer on a quartz glass layer in advance; forming another quartz glass layer on the siliceous sintered powder layer; firing the resultant to bond the siliceous sintered powder layer and each of the quartz glass layers to each other, to thereby produce an intermediate glass laminate.

FIG. 5 are schematic views for illustrating an example of the method of producing the intermediate glass laminate.

Figure 5A:
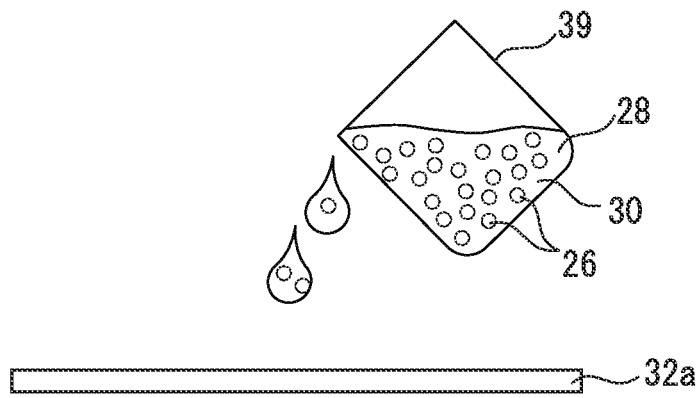
FIG. 5 are schematic views for illustrating an example of a method of producing an intermediate glass laminate to be used in a method of manufacturing a glass member with a heat reflective layer of the present invention.
Figure 5B:
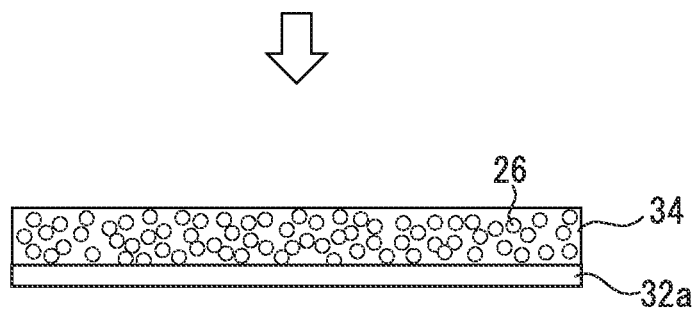
Figure 5C:
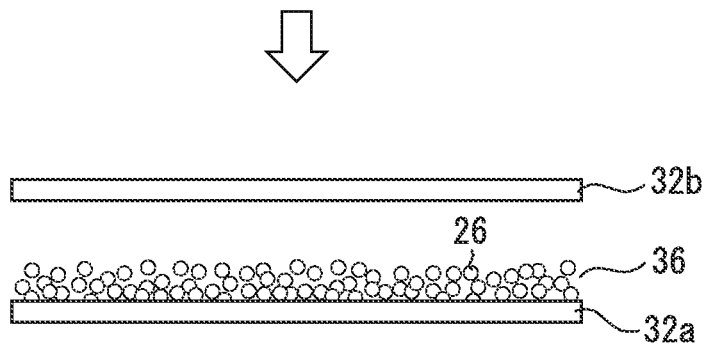
Figure 5D:
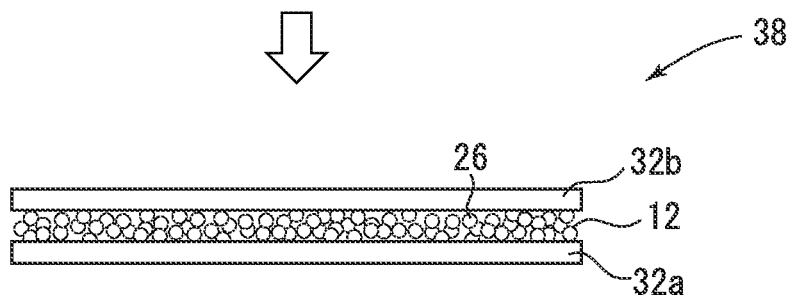

A method of producing the above-mentioned intermediate laminate having a laminated structure in which quartz glass members are formed on the upper surface and the lower surface of a silica powder layer suitably includes, for example, as illustrated in FIG. 5, the steps of: applying a slurry 30 containing silica glass particles 26 and water 28 onto the surface of a first quartz glass member 32a [FIG. 5(a)], to thereby form an application film 34 [FIG. 5(b)]; drying the application film 34, to thereby form a silica powder layer 36; and placing a second quartz glass member 32b on the silica powder layer 36 on the first quartz glass member 32a [FIG. 5(c)], to thereby form an intermediate laminate. When the intermediate laminate is heated, the silica powder layer 36 is turned into the siliceous sintered powder layer 12, and the intermediate laminate is integrated, and thus an intermediate glass laminate 38 can be formed [FIG. 5(d)]. In FIG. 5, a container containing the slurry 30 is denoted by reference numeral 39.

Known silica glass particles may be used as the silica glass particles to be used in the slurry, but silica glass particles having an average particle diameter of from 0.1 µm to 5 µm are suitable. In addition, an organic binder capable of gelling by a thermal factor in an aqueous solution may be added. The content of the silica glass particles in the slurry is not particularly limited, but is suitably from 50 mass % to 80 mass %.

A known member made of quartz glass may be used as the quartz glass member. The quartz glass member is not particularly limited, but is suitably a transparent quartz glass member. As the transparent quartz glass member, a colorless and transparent quartz glass member is preferred, and a colorless and transparent quartz glass member having a thickness of 2 mm and a light transmittance of 80% or more at a wavelength of from 400 nm to 2,000 nm is more preferred.

In addition, the quartz glass member is not particularly limited even in its shape and the like, but is suitably, for example, a member having a sheet shape, a disc shape, a hemispherical shape, a cylindrical shape, or the like and having a uniform thickness.

It is preferred in terms of strength that the thickness of the quartz glass member be larger than that of the silica powder layer. Specifically, the thickness of the quartz glass member is preferably 0.5 mm or more. The upper limit value of the thickness of the quartz glass member is not particularly limited, but is practically 10 mm or less in terms of processing or the like.

In addition, the surface of the quartz glass member to be brought into contact with the silica powder layer suitably has a flatness of 0.1 mm or less. The flatness may be measured by placing a material to be measured on a flat surface plate and measuring the material with a laser displacement meter.

An application method for the slurry is not particularly limited as long as the method is capable of applying the slurry onto the surface of the quartz glass member, but a method involving forming a flat application film by a scraping method with a scraper or the like is suitable. As used herein, the "flatly applying" means application with a small application thickness distribution. Specifically, it is suitable that a flat application film be formed so that a silica powder layer obtained by drying an application film has a thickness distribution of 0.1 mm (±0.05 mm) or less. When the flat application film is formed, a flat silica powder layer can be formed, its adhesiveness to the quartz glass layer is improved, and the silica powder layer and the quartz glass layer can be easily integrated with each other by heating. The application film after the drying is suitably a silica powder layer having a flatness of 0.1 mm or less. The flatness of the silica powder layer may be determined from the in-plane height distribution of the silica powder layer.

When the silica powder layer is formed by drying the application film of the slurry, its handling becomes easy in the subsequent steps. It is thus suitable that a water content in the slurry be sufficiently dried.

A drying method for the application film is not particularly limited, but for example, the drying may be performed in a heating furnace for drying. A drying temperature is desirably lower than the temperature at which the silica glass particles of the silica powder layer are fixed. Specifically, the drying temperature is preferably from normal temperature (from 5° C. to 35° C.) to about 100° C.

The second quartz glass member is placed on the silica powder layer after the drying. Thus, the intermediate laminate is formed.

In the step of heating the intermediate laminate, when a heating temperature is an excessively low temperature, the particles are liable to be peeled off without being fixed. When the heating temperature is an excessively high temperature, the siliceous sintered powder layer is increased in bulk density, and is increased in sintering degree and becomes partially transparent, and is thus reduced in reflectance. Accordingly, the heating temperature is suitably from 800° C. to 1,350° C., more suitably from 1,100° C. to 1,300° C. A heating atmosphere is not particularly limited, but an air atmosphere is preferred.

In addition, in order to achieve stronger bonding at the time of heating the intermediate laminate, a weight (pressing pressure) may be utilized, and a weight (pressing pressure) of 1 g or more per square centimeter is suitably used.

The siliceous sintered powder layer to be obtained preferably has a bulk density of from 1.3 g/cm³ to 1.5 g/cm³.

The thickness of the siliceous sintered powder layer is preferably 0.1 mm or more, more preferably from 200 µm to 1,000 µm. When the thickness of the siliceous sintered powder layer is too large, in the step of obtaining, by heating, the siliceous sintered powder layer which has the particles of the silica powder layer fixed therein, and integrating the silica powder layer and the quartz glass members with each other, the contraction amount of the silica powder layer at the time of sintering is increased with respect to the quartz glass members so that the silica powder layer and the quartz glass members cannot be integrated with each other. As a result, peeling occurs, or cracks are liable to be generated in the siliceous sintered powder layer. In addition, the siliceous sintered powder layer preferably has a thickness distribution of ±0.05 mm or less.

The heat reflective member of the present invention may include one siliceous sintered powder layer or a plurality of siliceous sintered powder layers.

As a method of manufacturing the heat reflective member including a plurality of siliceous sintered powder layers, there are given, for example: a method involving, in the step of forming the intermediate laminate described above, using a quartz glass member having a dried silica powder layer formed thereon as the second quartz glass member, and forming the intermediate laminate in such a manner that the silica powder layer on the first quartz glass member and the silica powder layer on the second quartz glass member are joined with each other; a method involving using a plurality of first quartz glass members each having a dried silica powder layer formed thereon and using a quartz glass member free of a dried silica powder layer as the second quartz glass member, and forming the intermediate laminate by laminating the plurality of first quartz glass members in such a manner that the silica powder layers are prevented from being brought into contact with each other, and by arranging the second quartz glass member on the silica powder layer of the uppermost first quartz glass member; and a method involving forming the intermediate laminate by further laminating a quartz glass member having a dried silica powder layer formed thereon on the second quartz glass member in such a manner that the silica powder layer is brought into contact with the second quartz glass member. When the plurality of siliceous sintered powder layers are included, the siliceous sintered powder layers may be the same or different from each other. For example, a plurality of siliceous sintered powder layers having different particle diameter distributions of the silica glass particles may be included.

In addition, it is appropriate that the silica powder layer formed on the surface of the quartz glass layer in advance be kept at such a low sintering degree that the shape of the sintered powder layer can be maintained, and at the time of superimposition or thereafter, be further increased in temperature to be completely sintered, so as to be thereby bonded to and integrated with a quartz glass sheet on a bonded side.

Further, it is also useful that the quartz glass members each having the silica powder layer formed thereon be bonded to each other in such a manner that the powder layers are joined with each other.

By the above-mentioned method, the laminated structure which is prevented from occurrence of peeling, cracks, deformation, and the like, which is substantially free of a semi-transparent portion, which has an intermediate transparency between the transparency of the siliceous sintered powder layer and the transparency of each of the quartz glass layers, between the siliceous sintered powder layer and each of the quartz glass layers, and which includes the siliceous sintered powder layer having a satisfactory reflectance up to a boundary with each of the quartz glass layers can be easily manufactured.

In addition, by the above-mentioned method, a heat reflective member having excellent strength can be formed. The heat reflective member of the present invention is fractured at a load of preferably 5 N or more, more preferably 20 N or more per square centimeter when a load is applied to the quartz glass layers on the upper surface and the lower surface of the laminated structure in a direction parallel to the laminated structure.

The heat reflective member of the present invention is suitably used as heat insulating means for a high-temperature heat treatment furnace in a heat treatment step of the semiconductor industry for which low dust generation, low metal impurities, and rapid temperature-responsiveness are required.

FIG. 4 are each a schematic explanatory view for illustrating an example of a method of using the heat reflective member of the present invention. As specifically illustrated in FIG. 4(a), when the heat reflective member 10 of the present invention (having a disc shape, a cylindrical shape, or the like) is placed in a chamber 20, the heat reflective member 10 can reflect heat of the heater 22 placed in the chamber 20, to thereby improve thermal efficiency. In addition, as specifically illustrated in FIG. 4(b), it is suitable that the heat reflective member 10 of the present invention (having a cylindrical shape) be used as a cylindrical body of a cylindrical chamber, heat dissipation from the chamber be suppressed by the heat reflective member 10, and the heat reflective member 10 be used as a heating jig for efficiently heating a wafer 24.

EXAMPLES

Now, the present invention is more specifically described by way of Examples. It goes without saying that Examples are given for illustrative purposes and should not be interpreted as limiting the present invention.

Example 1

An intermediate glass laminate was produced by the method illustrated in FIG. 5, and was then subjected to laser processing. Thus, a disc-shaped quartz glass sheet-like member with a heat reflective layer (heat reflective member of the present invention) illustrated in FIG. 1 was produced.

First, a transparent quartz glass disc 32a having an outer diameter of 300 mm and a thickness of 3 mm and a transparent quartz glass disc 32b having an outer diameter of 280 mm and a thickness of 1.5 mm were prepared. In addition, the silica slurry 30 was prepared by mixing synthesized silica glass particles 26 having an average particle diameter of 1.5 µm and methyl cellulose in pure water 28 so that the contents of the silica glass particles 26 and methyl cellulose were 60% and 1%, respectively.

The silica slurry 30 was flatly applied onto one surface of the above-mentioned transparent quartz glass disc 32a having an outer diameter of 300 mm and a thickness of 3.0 mm, and dried at room temperature (23° C.) for 5 hours or more. Thus, the silica powder layer 36 having a thickness of 0.4 mm was formed. The above-mentioned transparent quartz glass disc 32b having an outer diameter of 280 mm and a thickness of 1.5 mm was placed on the silica powder layer 36 side of the transparent quartz glass sheet 32a, and heated at 1,100° C. for 3 hours in an air atmosphere furnace while a load of 5 g/cm$^2$ was applied thereto. Thus, a sheet-like member (intermediate glass laminate) 38 including the siliceous sintered powder layer 12 (average thickness: 0.4 mm) was formed.

The resultant intermediate glass laminate 38 was subjected to cut processing at an outer periphery thereof with a laser processing machine at an output of 500 (W) and a feed rate of 140 (mm/min). Thus, a quartz glass sheet-like member 10A with a heat reflective layer (heat reflective member of the present invention) having an outer diameter of 250 mm and a thickness of 4.9 mm, which included the siliceous sintered powder layer 12 and included the impermeable layer 16 and the buffer layer 14 at an outer periphery thereof, was formed.

The resultant quartz glass sheet-like member 10A was subjected to the following measurements.

<1. Immersion Test>

The resultant sheet-like member 10A was immersed in water for 1 hour, and the water immersion conditions were visually observed.

Water did not penetrate into the quartz glass sheet-like member 10A obtained in Example 1 by virtue of the impermeable layer 16, and liquid penetration into the siliceous sintered powder layer 12 was not observed.

<2. Measurement Test for Thickness or Width of Layers>

Figure 6:
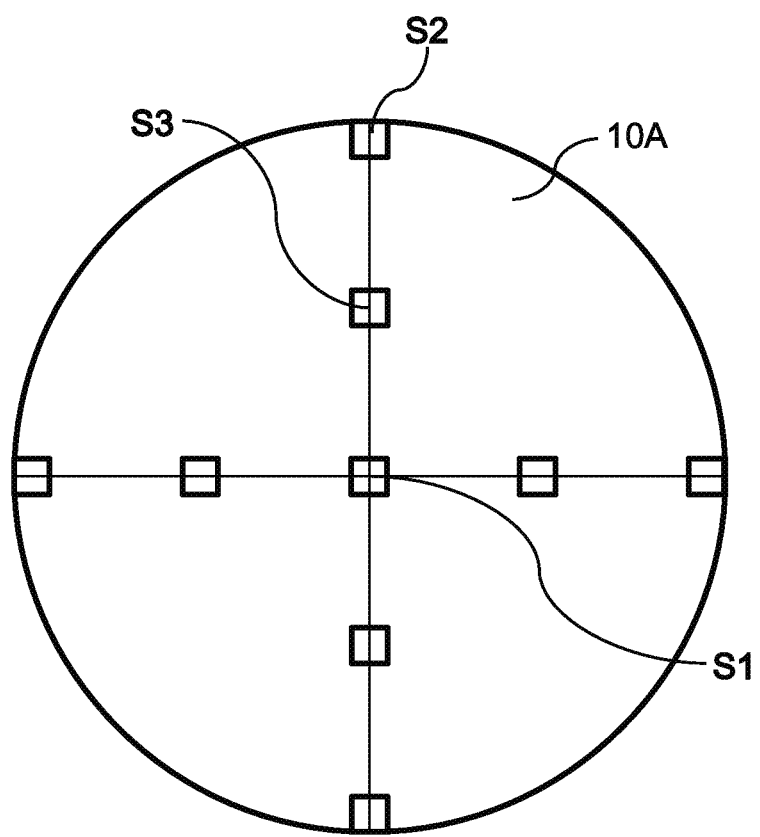
FIG. 6 is a plan view for illustrating measurement points for thickness measurement in Example 1.

Measurement points for the thickness "t" of the siliceous sintered powder layer 12, the width $W_1$ of the impermeable layer, and the width $W_2$ of the buffer layer in the resultant sheet-like member 10A are illustrated FIG. 6. As illustrated in FIG. 6, measurement was performed at a total of 9 measurement points: 1 point (S1) at the center of the disc; 4 points (S2) at the outer periphery thereof having been subjected to the laser processing provided every 90°; and 4 points (S3) as intermediate points between the center and the outer periphery thereof provided every 90°. Measurement samples were cut out so as to have a width of 5 mm, and cross-sections thereof were each observed in an enlarged manner with a microscope and measured for a thickness. An average value thereof was calculated. In addition, the cross-sections of the measurement samples taken at the outer periphery were each observed with a microscope and measured for the width $W_1$ of the impermeable layer and the width $W_2$ of the buffer layer. Average values thereof were calculated.

Figure 7A:
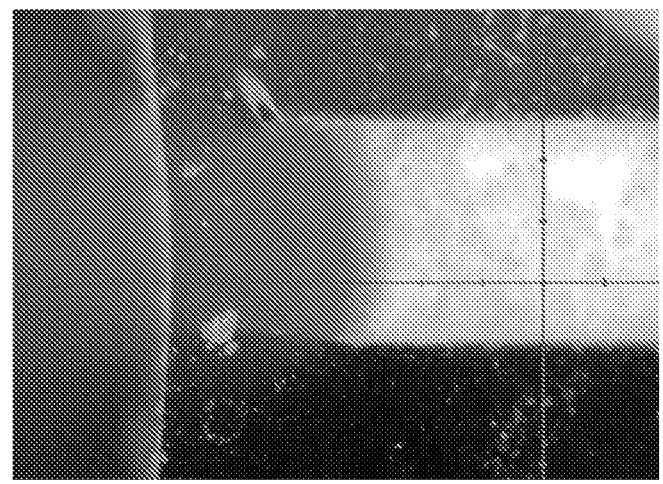
FIG. 7 are each a view showing results of Example 1.
Figure 7B:
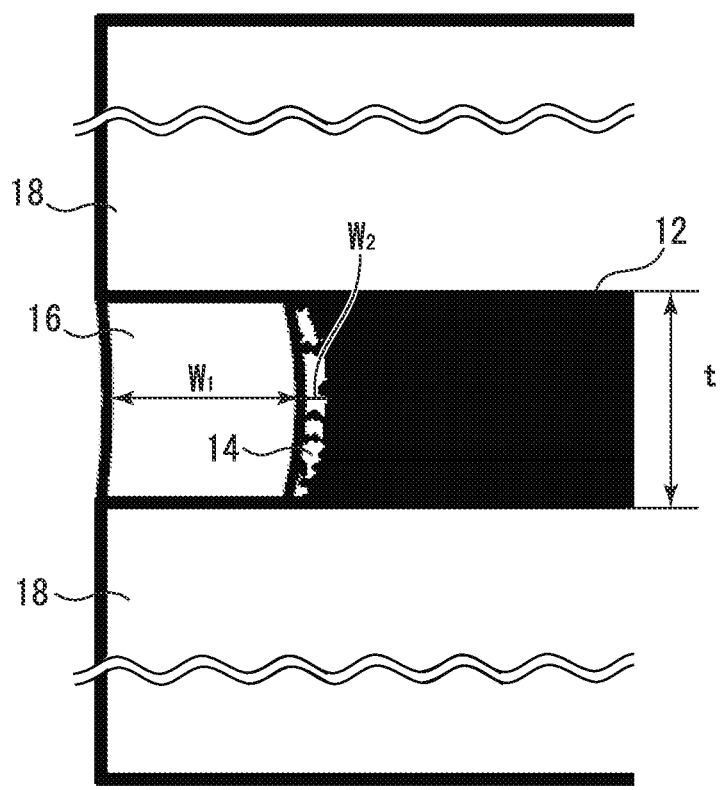

The thickness "t" of the siliceous sintered powder layer of the sheet-like member 10A obtained in Example 1 was found to be 400 µm on average (the minimum value thereof was 375 µm and the maximum value thereof was 420 µm). In addition, at the outer periphery having been subjected to the laser processing, an impermeable layer having an average thickness of 291 µm through which a liquid or a gas did not penetrate and a buffer layer having an average thickness of about 60 µm which gradually changed in density from the impermeable layer toward the sintered powder layer were observed. A sectional photograph of the outer periphery of the heat reflective member obtained in Example 1 is shown in FIG. 7(a), and a schematic view thereof is illustrated in FIG. 7(b).

<Durability Test in High-Temperature Environment>

The resultant sheet-like member was heated to 1,100° C., retained for 1 hour, and then cooled to room temperature (23° C.). The sheet-like member was subjected to a durability test by repeating the above-mentioned operation 10 times. As a result, no breakage, no peeling, and no cracks were generated.

<Reflectance Measurement>

A sample for reflectance measurement was cut out from the resultant sheet-like member and measured for a reflectance.

Reflectance measurement was performed as described below. The resultant sheet-like member was sampled at the same positions as the measurement points in the above-mentioned measurement of thickness of siliceous sintered powder layer, and samples for reflectance measurement were thus cut out. The reflectance was measured with a measurement device LAMBDA 950 (manufactured by PerkinElmer Co., Ltd.) with an integrating sphere. In the reflectance measurement, Spectralon reflectance target (manufactured by Labsphere) was used as a standard reflective material, and a relative reflectance was measured. In the subsequent Examples, reflectance measurement was performed by the same method.

As a result, the sheet-like member had a reflectance of from 78% to 83% at a wavelength of 2,000 nm, and a reflectance not falling below 78% at a wavelength of from 1,000 nm to 2,000 nm.

Example 2

An intermediate glass laminate was formed by the same method as in Example 1.

Before subjected to laser processing, the resultant intermediate glass laminate was preheated with flame of an oxyhydrogen burner at a position at an outer diameter of 250 mm to be subjected to laser processing. The preheating was such heating that the siliceous sintered powder layer was made slightly transparent. The sheet-like member was subjected to cut processing with a laser processing machine under the conditions of an output of 500 (W) and a feed rate of 140 (mm/min). Thus, a quartz glass sheet-like member with a heat reflective layer (heat reflective member of the present invention) having an outer diameter of 250 mm and a thickness of 4.9 mm, which included a silica sintered powder layer, was formed.

The resultant sheet-like member was subjected to the measurements by the same methods as in Example 1.

In the immersion test, penetration into the siliceous sintered powder layer was not observed.

In the thickness measurement for the layers, the thickness of the siliceous sintered powder layer was found to be 400 µm on average, and at the outer periphery having been subjected to the laser processing, an impermeable layer having an average thickness of 310 µm through which a liquid or a gas did not penetrate and a buffer layer having an average thickness of about 80 µm which gradually changed in density from the impermeable layer toward the sintered powder layer were observed.

In the durability test in a high-temperature environment, no breakage, no peeling, and no cracks were generated.

In the reflectance measurement, the sheet-like member had a reflectance not falling below 78% at a wavelength of from 1,000 nm to 2,000 nm.

Example 3

An intermediate glass laminate was formed by the same method as in Example 1.

Before subjected to laser processing, the resultant intermediate glass laminate was preheated through laser output by scanning a laser at a laser output of 50 (W) and a feed rate of 300 (mm/min) at a position to be subjected to laser processing.

Next, the sheet-like member was subjected to cut processing at an outer periphery thereof with a laser processing machine under the conditions of an output of 500 (W) and a feed rate of 140 (mm/min). Thus, a quartz glass sheet-like member with a heat reflective layer (heat reflective member of the present invention) having an outer diameter of 250 mm and a thickness of 4.9 mm, which included a silica sintered powder layer, was formed.

The resultant sheet-like member was subjected to the measurements by the same methods as in Example 1.

In the immersion test, penetration into the siliceous sintered powder layer was not observed.

In the thickness measurement for the layers, the thickness of the siliceous sintered powder layer was found to be 400 μm on average, and at the outer periphery having been subjected to the laser processing, an impermeable layer having an average thickness of 360 μm through which a liquid or a gas did not penetrate and a buffer layer having an average thickness of about 90 μm which gradually changed in density from the impermeable layer toward the sintered powder layer were observed.

In the durability test in a high-temperature environment, no breakage, no peeling, and no cracks were generated.

In the reflectance measurement, the sheet-like member had a reflectance not falling below 78% at a wavelength of from 1,000 nm to 2,000 nm.

Example 4

An intermediate glass laminate was formed by the same method as in Example 1.

The resultant intermediate glass laminate was subjected to laser cut processing at an outer periphery thereof with a laser processing machine at an output of 800 (W) and 1,000 (W), which were each higher than the output of 500 (W), and at a feed rate of 140 (mm/min), 100 (mm/min), and 50 (mm/min). Thus, a quartz glass sheet-like member with a heat reflective layer (heat reflective member of the present invention) having an outer diameter of 250 mm and a thickness of 4.9 mm, which included a siliceous sintered powder layer, was formed.

The resultant sheet-like member was subjected to the measurements by the same methods as in Example 1.

In the immersion test, liquid penetration into the siliceous sintered powder layer was not observed.

Figure 8:
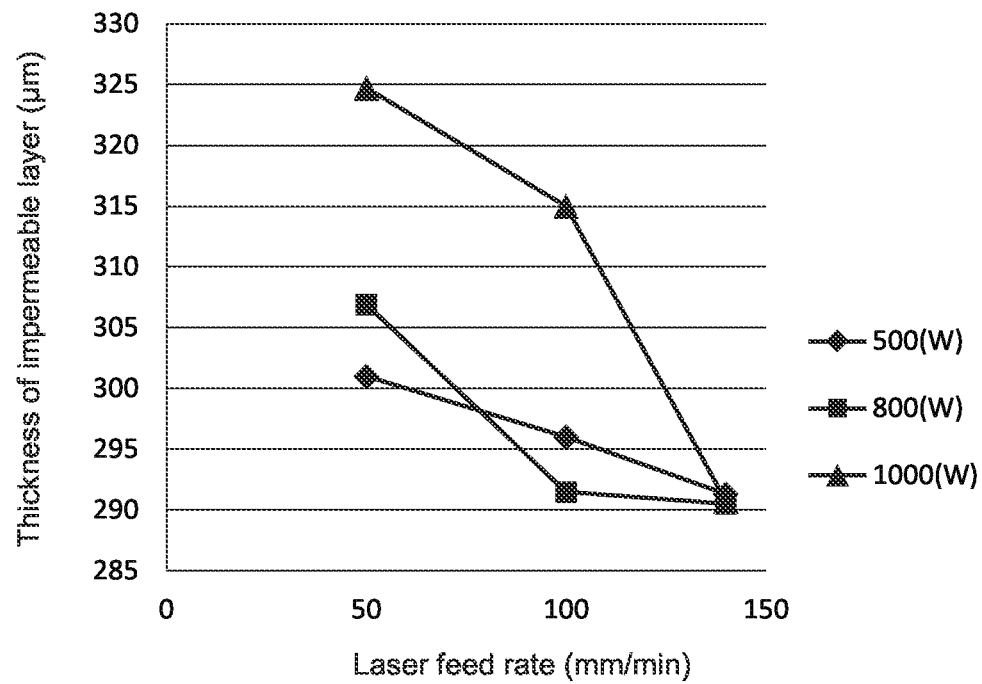
FIG. 8 is a graph showing results of the width of an impermeable layer of a heat reflective member obtained in Example 4.

In the thickness measurement for the layers, the thickness of the siliceous sintered powder layer was found to be 400 μm on average, and at the outer periphery having been subjected to the laser processing, an impermeable layer through which a liquid or a gas did not penetrate and a buffer layer which gradually changed in density from the impermeable layer toward the sintered powder layer were observed. The results of the width (average value) of the impermeable layer under the various laser processing conditions are shown in Table 1 and FIG. 8.

TABLE 1

Correlation between laser output and feed rate and thickness of impermeable layer

| | | Feed rate (mm/min) | | |
|---|---|---|---|---|
| | | 140 | 100 | 50 |
| Output (W) | 500 (W) | 291 | 296 | 301 |
| | 800 (W) | 291 | 292 | 307 |
| | 1,000 (W) | 291 | 315 | 325 |

(Thickness of impermeable layer: μm)

Example 5

A first transparent quartz glass disc having an outer diameter of 300 mm and a thickness of 3 mm, a second transparent quartz glass disc having an outer diameter of 280 mm and a thickness of 1.5 mm, and a third transparent quartz glass disc having an outer diameter of 270 mm and a thickness of 1.5 mm were prepared. A silica slurry was prepared by mixing synthesized silica glass particles having an average particle diameter of 1.5 μm and methyl cellulose in pure water so that the contents of the silica glass particles and methyl cellulose were 60% and 1%, respectively.

The silica slurry was flatly applied onto one surface of the above-mentioned first transparent quartz glass disc having an outer diameter of 300 mm and a thickness of 3.0 mm, and dried at room temperature (23° C.) for 5 hours or more. Thus, a silica powder layer having a thickness of 0.2 mm was formed.

By the same method, the silica slurry was flatly applied onto one surface of the above-mentioned second transparent quartz glass disc having an outer diameter of 280 mm and a thickness of 1.5 mm, and dried at room temperature for 5 hours or more. Thus, a silica powder layer having a thickness of 0.2 mm was formed.

The silica powder layer on the first transparent quartz glass disc having an outer diameter of 300 mm and the surface of the second transparent quartz glass disc having an outer diameter of 280 mm free of the silica powder layer were superimposed on each other. Further, the silica powder layer on the second transparent quartz glass disc and the third transparent quartz glass disc having an outer diameter of 270 mm were superimposed on each other. The resultant was heated at 1,100° C. for 3 hours in an air atmosphere furnace while a load of 5 g/cm$^2$ was applied thereto. Thus, a sheet-like member (intermediate glass laminate) including two siliceous sintered powder layers (average thickness: 0.2 mm) was formed.

The resultant intermediate glass laminate was subjected to cut processing at an outer periphery thereof with a laser processing machine at an output of 500 (W) and a feed rate of 140 (mm/min). Thus, a quartz glass sheet-like member with a heat reflective layer (heat reflective member of the present invention) having an outer diameter of 250 mm and a thickness of 6.4 mm, which included a siliceous sintered powder layer, was formed.

The resultant sheet-like member was subjected to the measurements by the same methods as in Example 1.

In the immersion test, penetration into the siliceous sintered powder layer was not observed.

In the thickness measurement for the layers, the thicknesses of the two siliceous sintered powder layers were each found to be 200 μm on average, and at each of end portions of the two siliceous sintered powder layers at the outer periphery having been subjected to the laser processing, an impermeable layer having an average thickness of 290 μm through which a liquid or a gas did not penetrate and a buffer layer having an average thickness of about 60 μm which gradually changed in density from the impermeable layer toward the sintered powder layer were observed.

In the durability test in a high-temperature environment, no breakage, no peeling, and no cracks were generated.

In the reflectance measurement, the infrared reflectance at a wavelength of 2,000 nm was higher than in the case of one siliceous sintered powder layer having a thickness of 0.4 mm (Example 1) by 5%.

Example 6

A first transparent quartz glass disc having an outer diameter of 300 mm and a thickness of 3 mm, a second transparent quartz glass disc having an outer diameter of 280 mm and a thickness of 1.5 mm, and a third transparent quartz glass disc having an outer diameter of 270 mm and a thickness of 1.5 mm were prepared.

A first silica slurry was prepared by mixing synthesized silica glass particles having an average particle diameter of 1.5 μm and methyl cellulose in pure water so that the contents of the silica glass particles and methyl cellulose were 60% and 1%, respectively. In addition, a second silica slurry was prepared by mixing synthesized silica glass particles having an average particle diameter of 1.0 μm and methyl cellulose in pure water so that the contents of the silica glass particles and methyl cellulose were 60% and 1%, respectively.

The first silica slurry was flatly applied onto one surface of the first transparent quartz glass disc having an outer diameter of 300 mm and a thickness of 3.0 mm, and dried at room temperature (23° C.) for 5 hours or more. Thus, a silica powder layer having a thickness of 0.2 mm was formed.

By the same method, the second silica slurry was flatly applied onto one surface of the second transparent quartz glass disc having an outer diameter of 280 mm and a thickness of 1.5 mm, and dried at room temperature for 5 hours or more. Thus, a silica powder layer having a thickness of 0.2 mm was formed.

The silica powder layer on the first transparent quartz glass disc having an outer diameter of 300 mm and the surface of the second transparent silica glass disc having an outer diameter of 280 mm free of the silica powder layer were superimposed on each other. Further, the silica powder layer on the second transparent quartz glass disc and the third transparent quartz glass disc having an outer diameter of 270 mm were superimposed on each other. The resultant was heated at 1,100° C. for 3 hours in an air atmosphere furnace while a load of 5 g/cm² was applied thereto. Thus, a sheet-like member (intermediate glass laminate) including two siliceous sintered powder layers (average thickness: 0.2 mm) was formed.

The resultant intermediate glass laminate was subjected to cut processing with a laser processing machine at an output of 500 (W) and a feed rate of 140 (mm/min). Thus, a quartz glass sheet-like member with a heat reflective layer (heat reflective member of the present invention) having an outer diameter of 250 mm and a thickness of 6.4 mm, which included a siliceous sintered powder layer, was formed.

The resultant sheet-like member was subjected to the measurements by the same methods as in Example 1.

In the immersion test, penetration into the siliceous sintered powder layer was not observed.

In the thickness measurement for the layers, the thicknesses of the two siliceous sintered powder layers were each found to be 200 μm on average, and at each of end portions of the two siliceous sintered powder layers at the outer periphery having been subjected to the laser processing, an impermeable layer having an average thickness of 290 μm through which a liquid or a gas did not penetrate and a buffer layer having an average thickness of about 60 μm which gradually changed in density from the impermeable layer toward the sintered powder layer were observed.

In the durability test in a high-temperature environment, no breakage, no peeling, and no cracks were generated.

In the reflectance measurement, the infrared reflectance at a wavelength of 2,000 nm was higher than in the case of one siliceous sintered powder thin-film layer having a thickness of 0.4 mm (Example 1) by 8%.

Comparative Example 1

An attempt was made to produce a quartz glass sheet-like member including a siliceous sintered powder layer by a method illustrated in FIG. 9. Two transparent quartz glass discs (40a and 40b) each having an outer diameter of 250 mm and a thickness of 3 mm were prepared. As illustrated in FIG. 9(a), one surface of the transparent quartz glass disc 40a as a first sheet was subjected to counterbore processing at a diameter of 240 mm and a depth of 0.4 mm, and subjected to chamfering at 4.5 mm in an outer radial direction and 2 mm in a height direction to form a chamfered portion 42. As illustrated in FIG. 9(b), one surface of the transparent quartz glass disc 40b as a second sheet was subjected to chamfering at 4.5 mm in an outer radial direction and 2 mm in a height direction to form a chamfered portion 42.

A silica slurry was prepared by mixing synthesized silica glass particles having an average particle diameter of 1.5 μm and methyl cellulose in pure water so that the contents of the silica glass particles and methyl cellulose were 60% and 1%, respectively.

The above-mentioned silica slurry was flatly applied to a recessed portion on a counterbore surface side of the transparent quartz glass disc 40a having been subjected to the counterbore processing, and dried at room temperature for 5 hours or more. Thus, a silica powder layer having an average thickness of 0.4 mm was formed.

The transparent quartz glass disc 40a having the silica powder layer formed on one surface thereof was heated at 1,100° C. for 3 hours in an air atmosphere furnace. Thus, a sheet-like member including a siliceous sintered powder layer 44 (average thickness: 0.4 mm) on one surface of the glass disc was formed.

Figure 9A:
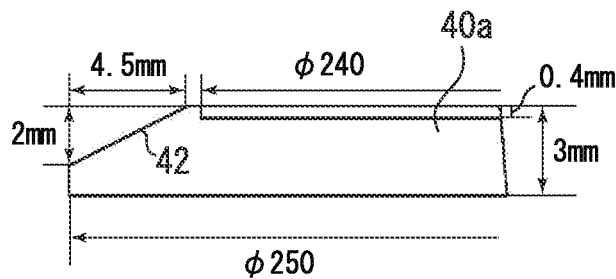
FIG. 9 are schematic explanatory views for illustrating a method of manufacturing a quartz glass sheet-like member of Comparative Example 1.
Figure 9A:
Figure 9B:
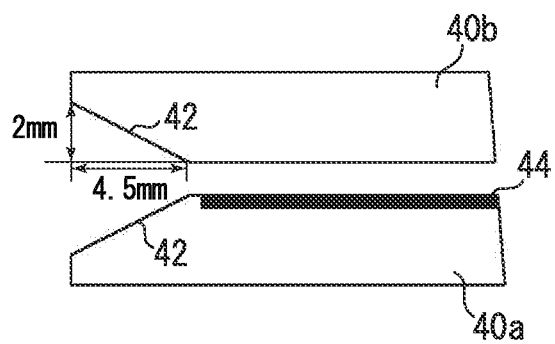
Figure 9B:
Figure 9C:
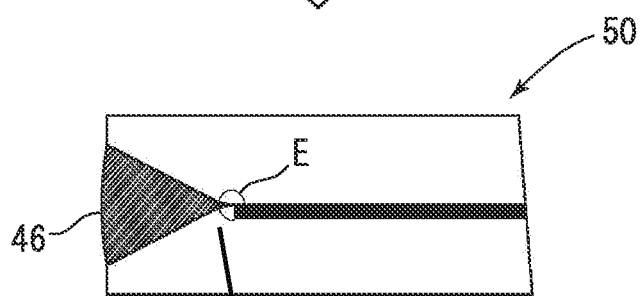
Figure 9D:
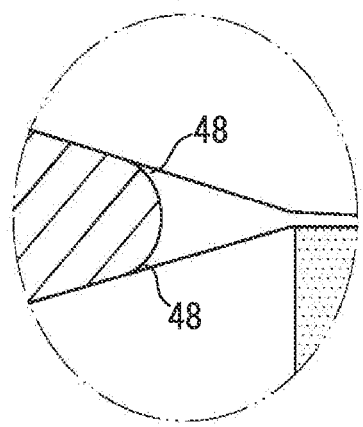

As illustrated in FIG. 9(b), the transparent quartz glass disc 40b having been subjected to the chamfering was placed on the resultant sheet-like member 40a. After that, as illustrated in FIG. 9(c), a wedge-shaped opening at an outer periphery of the sheet-like member was subjected to overlay welding with a welding rod made of quartz glass in order to achieve integration and sealing around the discs. After the completion of all-around welding, the resultant was subjected to stress relieving annealing in an electric furnace. Thus, a quartz glass sheet-like member 50 including the siliceous sintered powder layer 44 was produced. FIG. 9(d) is an enlarged view of a portion E of FIG. 9(c). In FIG. 9, an overlay-welded portion is denoted by reference numeral 46, and an undercut portion is denoted by reference numeral 48.

The above-mentioned series of production operations were performed in three examples. In the first example and the second example, the quartz glass sheet-like member was broken by the influence of strain caused by heat processing when about ¾ of the periphery was welded. In the third example, large cracks were found in the welded portion in observation after the stress relieving annealing.

Further, in the third example, the resultant quartz glass sheet-like member was subjected to the durability test in the same manner as in Example 1, and as a result, breakage of the member was observed. An unbroken portion of the member having been broken in the durability test was observed with a strain tester, and as a result, strain was observed in the undercut portion 48, and stress concentration was recognized.

Comparative Example 2

An intermediate glass laminate was formed by the same method as in Example 1.

For the purpose of further increasing the width of an impermeable layer to be formed by laser processing, the resultant intermediate glass laminate was subjected to heat processing at an outer periphery thereof with flame of an oxyhydrogen burner.

The intermediate glass laminate was broken by the influence of strain caused by the heat processing when about ¾ of the periphery was fired.

Comparative Example 3

An intermediate glass laminate was formed by the same method as in Example 1.

For the purpose of further increasing the width of an impermeable layer to be formed by laser processing, an attempt was made to subject an outer peripheral side surface of the resultant intermediate glass laminate to "glass overlay welding". However, the intermediate glass laminate was broken when ½ of the periphery was welded during welding processing.

REFERENCE SIGNS LIST

10, 10A, 10B, 10C: heat reflective member, 12, 44: siliceous sintered powder layer, 14: buffer layer, 16: impermeable layer, 18, 40a, 40b: quartz glass member, 20: chamber, 22: heater, 24: wafer, 26: silica glass particle, 28: water, 30: slurry, 34: application film, 36: silica powder layer, 38: intermediate glass laminate, 39: container, 42: chamfered portion, 46: overlay-welded portion, 48: undercut portion, 50: quartz glass sheet-like member, S1, S2, S3: measurement point, t: thickness of siliceous sintered powder layer, $W_1$: width of impermeable layer, $W_2$: width of buffer layer.

The invention claimed is:

1. A method of manufacturing a glass member with a heat reflective layer, comprising steps of:
   producing an intermediate glass laminate having a laminated structure in which a siliceous sintered powder layer is formed between an upper quartz glass layer and a lower quartz glass layer;
   wherein the siliceous sintered powder layer is the heat reflective layer; and
   cutting out the intermediate glass laminate into a predetermined shape with a laser thereby generating an impermeable layer and a buffer layer simultaneously with the laser cutting at a cut-out end portion of the siliceous sintered powder layer, wherein the impermeable layer is formed at the cut-out end portion by densifying the siliceous sintered powder layer with heat from the laser, wherein the buffer layer is formed adjacent to the impermeable layer, and spaced in a direction away from the cut-out end portion by the impermeable layer, from partially densifying the siliceous sintered powder layer with heat from the laser, and wherein said buffer layer changes in density from the impermeable layer toward the siliceous sintered powder layer.

2. The method of manufacturing a glass member with a heat reflective layer according to claim 1, comprising:
   prior to the cutting out of the intermediate glass laminate, heating and firing the siliceous sintered powder layer with a laser at a power enough to keep the sintered powder layer from cutting or with burner flame from a quartz glass layer side on an outer surface along a site of the intermediate glass laminate to be cut out into a predetermined shape, to thereby form a fired site including an intermediate buffer layer or an intermediate buffer layer and an intermediate impermeable layer.

3. The method of manufacturing a glass member with a heat reflective layer according to claim 1, wherein the buffer layer has a density gradient that decreases in density from the impermeable layer, which has a first density, toward the siliceous sintered powder layer, which has a second density, wherein the first density is higher than the second density.

4. A method of manufacturing a glass member with a heat reflective layer, comprising steps of:
   producing an intermediate glass laminate having a laminated structure in which a siliceous sintered powder layer is formed between an upper quartz glass layer and a lower quartz glass layer wherein the siliceous sintered powder layer is the heat reflective layer;
   heating and firing the siliceous sintered powder layer with a laser at a power enough to keep the siliceous sintered powder layer from cutting or with burner flame from a quartz glass layer side on an outer surface along a site of the intermediate glass laminate to be cut out into a predetermined shape, to thereby form a fired site including an intermediate buffer layer or an intermediate buffer layer and an intermediate impermeable layer; and
   further cutting out a position at which the fired site is formed with a laser so that the intermediate buffer layer and, if applicable, the intermediate impermeable layer are modified, so as to form an end portion structure including a buffer layer and a stronger impermeable layer, wherein said buffer layer changes in density from the impermeable layer toward the siliceous sintered powder layer, wherein the modified impermeable layer is formed at the cut-out end portion by densifying the siliceous sintered powder layer with heat from the laser, wherein the modified buffer layer is formed adjacent to the modified impermeable layer, and spaced in a direction away from the cut-out end portion by the modified impermeable layer by partially densifying the siliceous sintered powder layer.

* * * * *